(12) United States Patent
Mohebbi et al.

(10) Patent No.: US 10,222,432 B2
(45) Date of Patent: Mar. 5, 2019

(54) BIRDCAGE RESONATOR FOR MAGNETIC RESONANCE

(71) Applicant: QUANTUM VALLEY INVESTMENT FUND LP, Waterloo (CA)

(72) Inventors: Hamidreza Mohebbi, Kitchener (CA); David G. Cory, Branchton (CA); Grum Teklemariam, Kitchener (CA)

(73) Assignee: Quantum Valley Investment Fund LP, Waterloo, Ontario ( * ) Notice: Subject to any disclaimer, the term of this patent is extended or adjusted under 35 U.S.C. 154(b) by 138 days.

(21) Appl. No.: 15/307,088

(22) PCT Filed: Jun. 17, 2014

(86) PCT No.: PCT/CA2014/000504
§ 371 (c)(1),
(2) Date: Oct. 27, 2016

(87) PCT Pub. No.: WO2015/192197
PCT Pub. Date: Dec. 23, 2015

(65) Prior Publication Data
US 2017/0052235 A1    Feb. 23, 2017

(51) Int. Cl.
*G01R 33/34*    (2006.01)

(52) U.S. Cl.
CPC ... *G01R 33/34076* (2013.01); *G01R 33/3403* (2013.01); *G01R 33/34007* (2013.01); *G01R 33/34023* (2013.01)

(58) Field of Classification Search
CPC ........ G01R 33/34007; G01R 33/34046; G01R 33/34076; G01R 33/34023;
(Continued)

(56) References Cited

U.S. PATENT DOCUMENTS

| 5,872,452 A | 2/1999 | Cory et al. |
| 6,100,694 A | 8/2000 | Wong |

(Continued)

FOREIGN PATENT DOCUMENTS

| WO | WO2001/094964 | 12/2001 |
| WO | 2014/117256 | 8/2014 |
| WO | 2014/176665 | 11/2014 |

OTHER PUBLICATIONS

EPO, Extended European Search Report dated Feb. 16, 2018 in EP App. 14895060.3, 9 pgs.
(Continued)

*Primary Examiner* — Rodney A Bonnette
(74) *Attorney, Agent, or Firm* — Henry Patent Law Firm PLLC

(57) ABSTRACT

In some aspects, a resonator device for magnetic resonance applications is described. In some examples, the resonator device includes a resonator body that includes a periodic arrangement of cells about a central interior region. Each cell includes a dielectric substrate and a conductor disposed on the dielectric substrate. The periodic arrangement of the cells defines a periodic network of inductive and capacitive elements adapted to produce a magnetic field in the central interior region. The cells can be arranged according to various topologies that form various capacitive and inductive schemes. In some implementations, a dielectric substrate and thin superconductor are used, and the resonator device exhibits a high quality factor (Q) and low losses.

14 Claims, 12 Drawing Sheets

(58) Field of Classification Search
CPC ........ G01R 33/34092; G01R 33/34061; G01R 33/3635; G01R 33/3415; G01R 33/3815; G01R 33/3453; G01R 33/365; G01R 33/5611; G01R 33/307; G01R 33/341; G01R 33/345; G01R 33/385; G01R 33/403

See application file for complete search history.

(56) References Cited

U.S. PATENT DOCUMENTS

| | | |
|---|---|---|
| 6,285,189 B1 | 9/2001 | Wong |
| 6,377,047 B1 | 4/2002 | Wong et al. |
| 6,420,871 B1 | 7/2002 | Wong et al. |
| 6,727,700 B2 | 4/2004 | Marek |
| 7,193,418 B2 | 3/2007 | Freytag |
| 8,106,656 B2 | 1/2012 | Wosik et al. |
| 2002/0190715 A1 | 12/2002 | Marek |
| 2011/0074422 A1 | 3/2011 | Zhang et al. |
| 2011/0210735 A1* | 9/2011 | Trakic ................ G01R 33/5659 324/309 |
| 2012/0074935 A1 | 3/2012 | Crozier et al. |
| 2013/0335086 A1 | 12/2013 | Shah et al. |

OTHER PUBLICATIONS

Canadian Intellectual Property Office; International Search Report & Written Opinion for PCT/CA2014/000406; dated Feb. 23, 2015; 8 pages; Quebec, CA.

T. Borneman and D. Cory, Bandwidth-Limited Control and Ringdown Suppression in High-Q Resonators, arXiv:1207.1139v2 [quant-ph], J. Magn. Res., 225, 120-29 (2012) 22 pages.

* cited by examiner

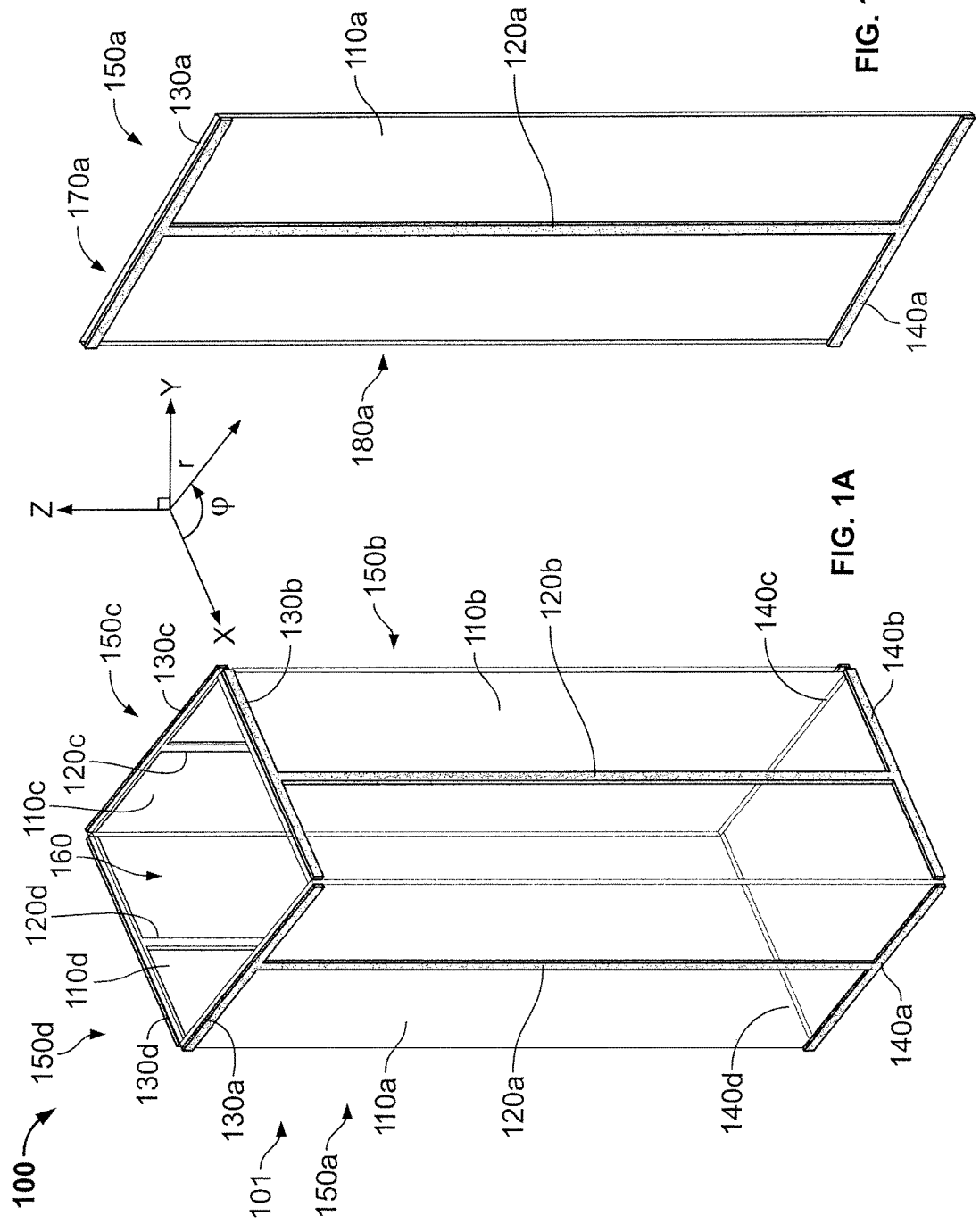

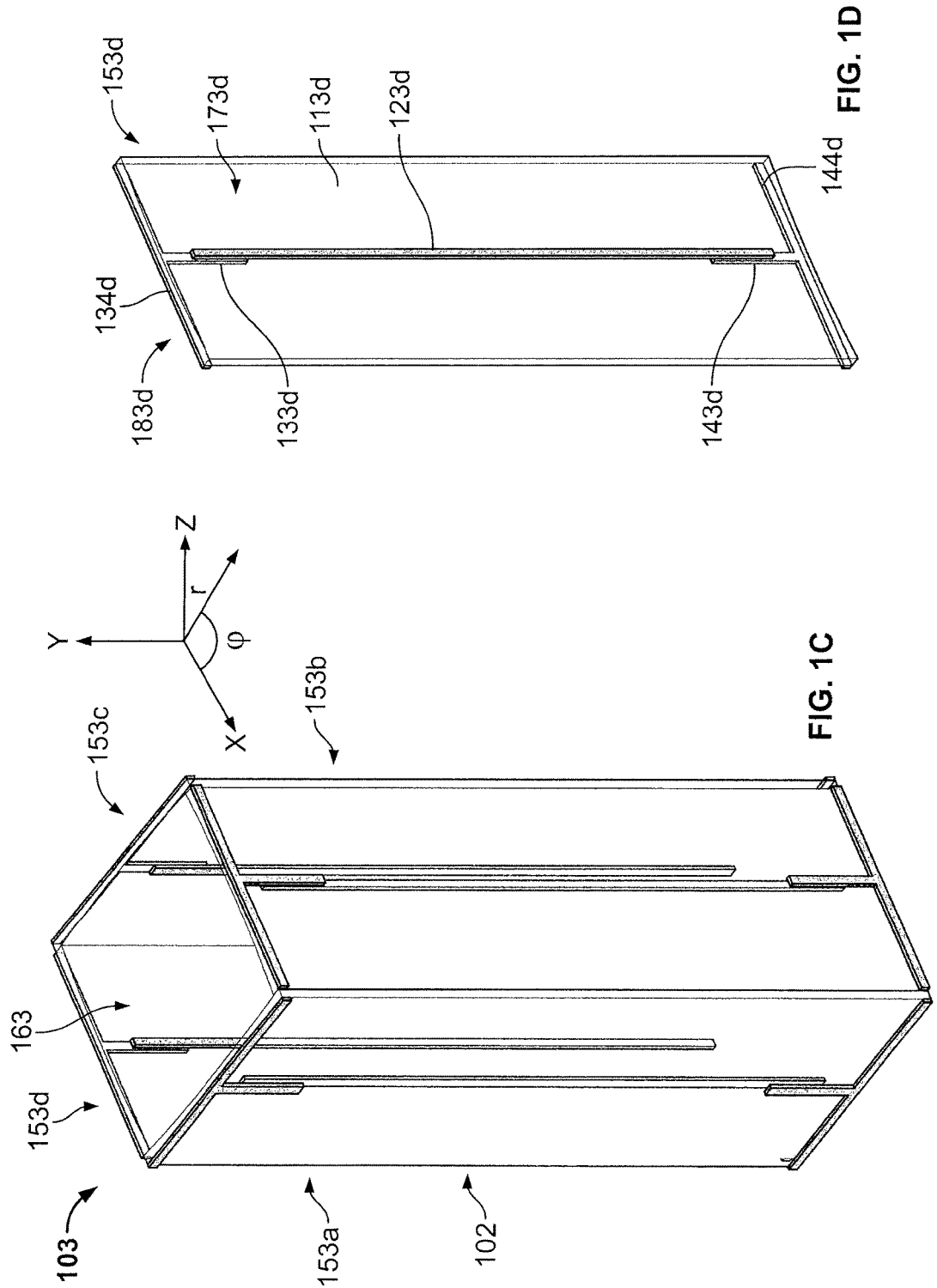

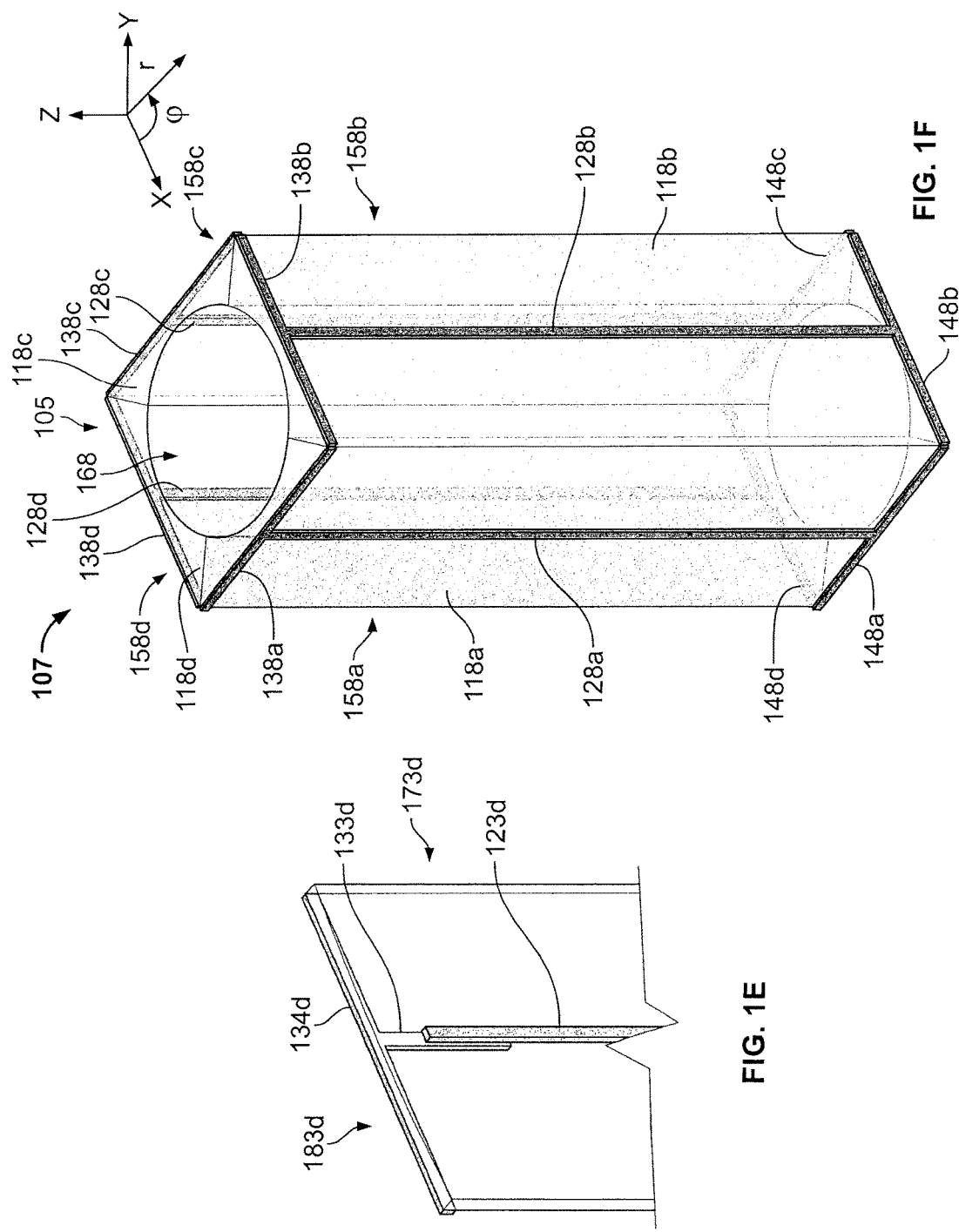

| | $\omega_0$ | $\omega_1$ | $\omega_2$ | $\omega_3$ | $\omega_4$ | $\omega_5$ | $\omega_6$ | $\omega_7$ |
|---|---|---|---|---|---|---|---|---|
| N=4 | $\sqrt{\dfrac{1}{L_R C_R}}$ | $\sqrt{\dfrac{C_R+C_L}{C_R C_L (L_R+L_L)}}$ | $\sqrt{\dfrac{2C_R+C_L}{C_R C_L (L_R+2L_L)}}$ | $\omega_1$ | --- | --- | --- | --- |
| N=6 | $\sqrt{\dfrac{1}{L_R C_R}}$ | $\sqrt{\dfrac{C_R+2C_L}{C_R C_L (2L_R+L_L)}}$ | $\sqrt{\dfrac{3C_R+2C_L}{C_R C_L (2L_R+3L_L)}}$ | $\sqrt{\dfrac{2C_R+C_L}{C_R C_L (L_R+2L_L)}}$ | $\omega_2$ | $\omega_1$ | --- | --- |
| N=8 | $\sqrt{\dfrac{1}{L_R C_R}}$ | $\sqrt{\dfrac{\sqrt{2}(C_R+C_L)-C_R}{C_R C_L [\sqrt{2}(L_R+L_L)-L_L]}}$ | $\sqrt{\dfrac{C_R+C_L}{C_R C_L (L_R+L_L)}}$ | $\sqrt{\dfrac{\sqrt{2}(C_R+C_L)+C_R}{C_R C_L [\sqrt{2}(L_R+L_L)+L_L]}}$ | $\sqrt{\dfrac{C_R+2C_L}{C_R C_L (2L_R+L_L)}}$ | $\omega_3$ | $\omega_2$ | $\omega_1$ |

FIG. 6

BIRDCAGE RESONATOR FOR MAGNETIC RESONANCE

BACKGROUND

This specification relates to thin-film resonator devices for magnetic resonance applications.

Magnetic resonance systems are used to study various types of samples and phenomena. A resonator manipulates the spins in a sample by producing a magnetic field at or near the spins' resonance frequencies. In some cases, the resonator detects the spins based on a voltage induced by the precessing spins.

SUMMARY

In a general aspect, a resonator device for magnetic resonance applications is described. The resonator device can include multiple cells arranged in a three-dimensional geometry to produce a resonant radio- or microwave-frequency magnetic field. In some instances, the cells can be fabricated to produce a high-Q, low-loss resonator.

The details of one or more implementations are set forth in the accompanying drawings and the description below. Other features, objects, and advantages will be apparent from the description and drawings, and from the claims.

DESCRIPTION OF DRAWINGS

FIG. 1A is a perspective view of an example birdcage resonator device; FIG. 1B is a perspective view of the example cell 150a of the example birdcage resonator device of FIG. 1A.

FIG. 1C is a perspective view of another example birdcage resonator device; FIGS. 1D is a perspective view of the example cell 153d of the example birdcage resonator device of FIG. 1C; FIG. 1E is an enlarged perspective view of the upper portion of the cell 153d of FIG. 1D.

FIG. 1F is a perspective view of another example birdcage resonator device.

FIG. 6 is a table showing resonant frequencies of an example birdcage resonator device.

Like reference symbols in the various drawings indicate like elements.

DETAILED DESCRIPTION

Figure 1H:
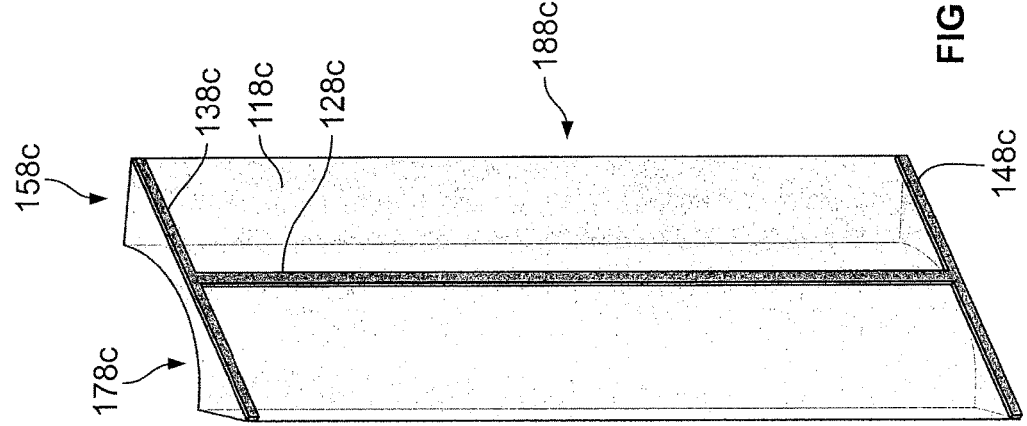
FIGS. 1G and 1H are different perspective views of the example cell 158c of the example birdcage resonator device in FIG. 1F.

In some implementations, a resonator device is designed to excite, control and detect spins. For example, the resonator device may read-out the signal in a nuclear magnetic resonance spectrometer. In some examples, the resonator device has a high quality factor, low mode volume, and a large filling factor. Some of the example resonator devices described here can be used, for example, for nuclear magnetic resonance (NMR) spectroscopy, electron spin resonance (ESR) spectroscopy, nuclear quadrupole resonance (NQR) spectroscopy, magnetic resonance imaging (MRI), quantum technologies, or other applications.

In some instances, the resonator device can have a birdcage structure that includes a ladder network of inductive and capacitive (LC) elements. The ladder network includes a periodic arrangement of multiple cells arranged into a generally cylindrical, prismatic, or another type of geometry. The cells can form the lateral faces of the structure. Various topologies can be used for the unit cells of the resonator. In some cases, each cell is effectively a resonator, and the cells are substantially identical (e.g., structurally and electrically equivalent) to each other. The cells can be assembled into a three-dimensional network to form a magnetic resonance (MR) probe, such as, for example, a radio-frequency (RF) probe for nuclear magnetic resonance (NMR) applications. The spatial dimensions (e.g., height, length, width) of the resonator device can range from millimeters in some cases to many centimeters in other cases. The operating frequency of the resonator device can range from kHz in some cases to GHz (e.g., 10 GHz or more) in other cases. In some instances, the resonator device can operate at cryogenic temperatures (e.g., liquid nitrogen temperatures, liquid helium temperatures, or other cryogenic temperatures), or the resonator device can operate at higher temperatures (e.g., room temperature).

In some implementations, each cell is made of a substrate with a conductor or superconducting conductor deposited on the substrate. The substrate can be a dielectric material with high thermal conductivity. For example, the dielectric material can include silicon, diamond, sapphire ($Al_2O_3$), $LaAlO_3$, MgO, or another material. The conductor can be made of high-temperature superconductors (HTS) (e.g., yttrium barium copper oxide (YBCO)), low temperature superconductors (LTS) (e.g., niobium (Nb)), other conductors (e.g., copper) or composites of these. The resonator can be electrically coupled with coaxial cables or another type of link that provides electrical communication between the resonator and an external control system.

In some implementations, the example birdcage resonator device can be used as a transmitter for transmitting and as a receiver for receiving signals. For instance, the example birdcage resonator device can be used as an MR probe that is the primary interface between the spins in a sample and the MR electronics and spectrometer, and the MR probe can manipulate the spins and detect precession of the spins. In some cases, an MR probe can be characterized by its signal-to-noise ratio (SNR). For some resonators, the SNR is proportional to $$\frac{\sqrt{Q}}{V}\eta$$

where Q represents the qualify factor; $\eta$ represents the sample or subject filling factor; and V represents the mode volume.

In some implementations, the example birdcage resonator devices described here can be used as an MR probe. The birdcage resonator device can generate a highly homogeneous magnetic field and help achieve a low mode volume V. In some cases, while having a low mode volume V and a high sample filling factor $\eta$, the birdcage resonator device can operate on resonance with the spins and maintain a sharp bandwidth so the qualify factor Q is high, and the device achieves a high signal-to-noise ratio (SNR).

In some instances, the example birdcage resonator devices described here can reduce the electrical noise that can reduce the SNR of an MR probe. For example, the birdcage resonator device has a narrow bandwidth so that noise outside the narrow bandwidth are not coupled to the receiver.

In some instances, the example birdcage resonator devices described here can be implemented as a compact device, for example, sized to fit into a cryostat system that cools the probes to reduce the intrinsic noise levels. In some implementations, the example birdcage resonator device can generate a highly homogeneous magnetic field. For instance, N=4, 6,8, 16, 32, 64 cells can be assembled together. In some instances, the example birdcage resonator device can provide coherent quantum control of a spin system. In some implementations, the example birdcage resonator device can have low-pass and high-pass configurations. For example, for the high-pass configuration, the first mode can be transverse, whereas for the low-pass configuration, the first mode can be a gradient mode. The birdcage resonator device can include additional or different features or advantages.

FIG. 1A is a perspective view of an example birdcage resonator device 100. The example resonator device 100 includes a resonator body 101 that includes multiple cells 150a, 150b, 150c, 150d arranged in a prismatic geometry about a central interior region 160. The prismatic geometry includes four rectangular cells 150a, 150b, 150c, 150d that form a substantially closed circumferential surface about the central interior region 160. In general, a birdcage resonator device can include any number of cells that together forms a prism, cylinder, or another polyhedron.

In the diagram shown in FIG. 1A, the z-axis defines the axis of a cylinder or prism (also referred to as the axial or longitudinal direction); the x-y plane includes the radial direction r; and the azimuth φ defines the azimuthal or circumferential direction. The cells 150a, 150b, 150c, 150d extend parallel to the longitudinal direction and form the lateral faces of the resonator body 101. The cells 150a, 150b, 150c, 150d can be substantially identical to each other.

In the example shown in FIG. 1A, the cells 150a, 150b, 150c, 150d form a periodic arrangement along the circumferential direction. As shown, the cells define a symmetric structure. Each of the cells 150a, 150b, 150c and 150d includes a dielectric substrate (e.g., substrate 110a, 110b, 110c or 110d, respectively) and one or more resonant conductors deposited on the substrate. The periodic arrangement of the cells 150a, 150b, 150c and 150d defines a periodic network of inductive and capacitive elements. Each of the cells 150a, 150b, 150c and 150d can include one period of the periodic network of inductive and capacitive elements. The periodic network of inductive and capacitive elements can be adapted to produce a magnetic field in the central interior region 160. The central interior region 160 can hold a sample containing a spin ensemble, and the cells can produce a radio-frequency, microwave-frequency, or other frequency magnetic resonance field that interacts with the spin ensemble.

In some implementations, the conductors of each of the cells 150a, 150b, 150c, 150d can include one or more ring elements and leg elements. The leg element (also referred to as ladder element) can include an elongate conductor that extends parallel to the largest dimension of the central interior region, and the ring element can include a second elongate conductor that extends perpendicular to the leg element.

In the example shown in FIG. 1A, each of the cells 150a, 150b, 150c, and 150d includes a dielectric substrate (e.g., substrate 110a, 110b, 110c and 110d, respectively) and thin-film conductors (e.g., conductors 120a-d, 130a-d, and 140a-d, respectively) deposited on the dielectric substrate. Here, "thin-film" is used broadly to describe structures that are substantially larger in one or both dimensions (length and width) than in their thickness or height dimension. For instance, a thin-film can be a layer of material that has a thickness ranging from fractions of a nanometer to several micrometers. For example, the thin-film conductor can have a thickness ranging from 10 nanometers (nm) to many hundreds of nanometers. In some instances, a thin-film structure has a height that is substantially uniform (e.g., compared to the overall length and width of the structure) over its extent.

In the example shown in FIG. 1A, the substrate of each cell (e.g., substrate 110a, 110b, 110c and 110d, respectively) occupies substantially the entire surface area allocated to the cell (e.g., cells 150a, 150b, 150c, and 150d, respectively) in the closed circumferential surface defined by the resonator body. The substrate can be considered to occupy substantially the entire surface area allocated to a cell, for example, when the substrate occupies 90% to 100% of the surface area.

In the example shown in FIG. 1A, the cell 150a includes conductors 120a, 130a, and 140a deposited on the substrate 110a. The conductor 120a forms the leg element that extends parallel to the largest dimension of the central interior region 160 (i.e., in the axial direction) while the conductors 130a and 140a form the ring elements that extend perpendicular to the leg element 120a. Similarly, the cell 150b includes leg element conductor 120b, and ring element conductors 130b, 140b deposited on the substrate 110b; the cell 150c includes leg element conductor 120c, and ring element conductors 130c, 140c deposited on the substrate 110c; and the cell 150d includes leg element conductor 120d, and leg element conductors 130d, 140d deposited on the substrate 110d.

In the example shown in FIG. 1A, the four ring elements 130a, 130b, 130c, and 130d define a square at one end of the resonator body 101, while the four ring elements 140a, 140b, 140c, and 140d define a square at the opposing end of the resonator body 101. In some other implementations, for instance, six cells can be assembled together to form a hexagonal prism birdcage resonator. The six cells can form the lateral faces while the ring elements of the six cells can define hexagonal ends of the of the hexagonal prism resonator body.

FIG. 1B is a perspective view of the example cell 150a of the example birdcage resonator device 100 of FIG. 1A. The example cell 150a includes an interior surface 170a facing the central interior region 160 and an exterior surface 180a facing opposite the central interior region 160. As shown in FIG. 1B, the dielectric substrate 110a of the cell 150a is planar on both the interior surface 170a and the exterior surface 180a. Each of conductors 120a, 130a, and 140a are disposed on the exterior surface 180a of the cell 150. In general, the dielectric substrate can be planar; one or more of the conductors (e.g., the leg elements and ring elements) can be disposed on either the exterior or interior surface. Here, "planar" is used broadly to describe surfaces that are substantially flat or even or possesses significant areas that lie in the same plane.

FIG. 1C is a perspective view of another example birdcage resonator device 103. The example resonator device 103 includes a resonator body 102 that includes multiple cells 153a, 153b, 153c, 153d that define a substantially closed circumferential surface about a central interior region 163. The cells 153a, 153b, 153c, 153d are arranged symmetrically in a prismatic geometry similar to the example birdcage resonator device 100 in FIG. 1A. The cells 150a, 150b, 150c and 150d of the example birdcage device 100 in FIG. 1A are configured according to a different inductance and capacitance scheme than the cells 153a, 153b, 153c, 153d of the example birdcage device 103 in FIG. 1C.

FIG. 1D is a perspective view of the example cell 153d of the example birdcage resonator device 103 of FIG. 1C. The example cell 153d includes an interior surface 173d facing the central interior region 163 and an exterior surface 183d facing opposite the central interior region 163. The example cell 153d includes a dielectric substrate 113d and thin-film conductors 123d, 133d, 134d, 143d, 144d disposed on the dielectric substrate 113d. The dielectric substrate 113d of the cell 153d is planar on both the interior surface 173d and the exterior surface 183d. The cell 153d includes two ring elements conductors 134d and 144d and three leg element conductors 123d, 133d and 143d. FIG. 1E shows an enlarged perspective view of the upper portion of the cell 153d of FIG. 1D. As shown in FIGS. 1D and 1E, the ring element conductors 134d and 144d are deposited on the exterior surface 183d of the cell 153d. The two shorter leg element conductors 133d and 143d are deposited on the exterior surface 183d as well whereas the longer leg element conductors 123d is deposited on the interior surface 173d of the cell 153d. All three leg element conductors 123d, 133b and 143b extend longitudinally and are aligned with each other. The conductors 123d, 133d, 134d, 143d, 144d and the dielectric substrate 113d together form a sandwich structure and can enhance the capacitive coupling among the inductive and capacitive elements formed by the conductors 123d, 133d, 134d, 143d, 144d and the substrate 113d.

FIG. 1F is a perspective view of another example birdcage resonator device 107. The example resonator device 107 includes a resonator body 105 that includes multiple cells 158a, 158b, 158c, 158d that can be substantially identical to each other. The cells 158a, 158b, 158c, and 158d define a closed circumferential surface about a central interior region 168. The cells are assembled in a periodic arrangement along the circumferential direction.

Figure 1G:
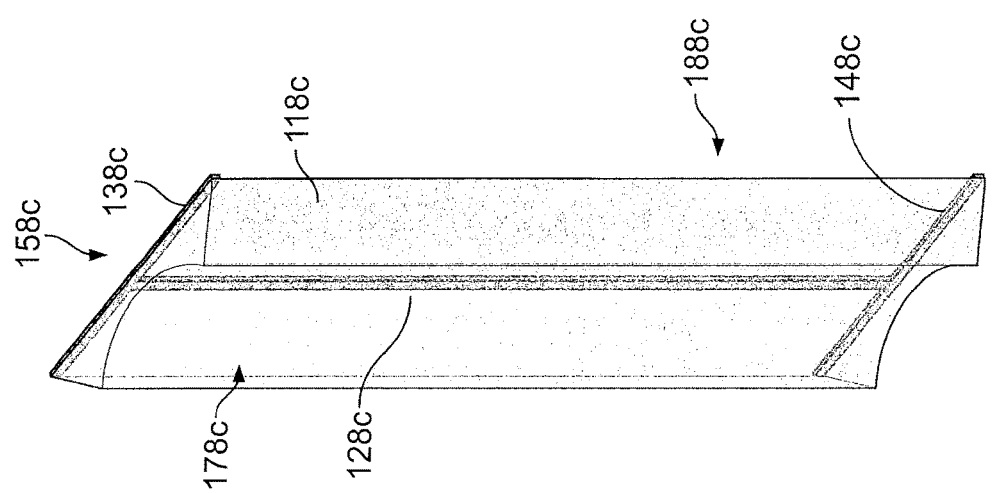

FIGS. 1G and 1H are perspective views of the example cell 158c of the example birdcage resonator device 107 of FIG. 1F from different angles. The example cell 158c includes an interior surface 178c facing the central interior region 168 and an exterior surface 188c facing opposite the central interior region 168. The example cell 158c includes a dielectric substrate 118c and conductors 128c, 138c and 148c disposed on the dielectric substrate 118c. The dielectric substrate 118c of the cell 158c is planar on the exterior surface 188c while curved on the interior surface 178c. As the example birdcage device 107 shown in FIG. 1F, the planar exterior surfaces of the cells 158a, 158b, 158c, 158d define a cuboid while the curved interior surfaces of the cells 158a, 158b, 158c, 158d define a cylinder around the central interior region 168. In general, the resonator body and can be designed and configured, for example, to fit a cooling system, to accommodate a sample, or for other purposes.

The example cell 158c includes ring element conductors 138c and 148c and leg element conductors 128c. The ring element conductors 138c and 148c and the leg element are deposited on the exterior surface 188c of the cell 158c, having a similar topology as the example cell 150c of FIGS. 1A and 1B.

In some implementations, the substrate (e.g., the substrate 110a-d, 113a-d or 118a-d) of a birdcage resonator device can be made of dielectric material such as, for example, sapphire, diamond, silicon, quartz, or another type of non-magnetic dielectric crystalline material. In some instances, the dielectric material of the substrate can be chosen such that it has high thermal conductivity at cryogenic temperatures. Such example dielectric materials can include sapphire ($Al_2O_3$), $LaAlO_3$, MgO, etc.

In some implementations, the resonant conductor (e.g., conductors 120a-d, 128a-d, 130a-d, 138a-d, 140a-d, 148a-d; 123d, 133d, 134d, 143d, 144d) of the birdcage resonator device can be made of superconducting material, such as, for example, niobium, niobium titanium, niobium nitride, aluminum, yttrium barium copper oxide (aka, "YBCO"), or another HTS or niobium (Nb) based material. The conductor of each cell can form an RF coil that can receive an input signal, conduct the signal across each cell, and generate a magnetic field. In some implementations, the superconductors can be used to help reduce the intrinsic noise level of the RF coils and hence increase SNR at cryogenic temperatures. In some implementations, the conductors can be made of other types of conducting material, such as, for example, non-superconducting materials including copper, gold, etc. The conductor can be deposited on the substrate by standard deposition techniques. The substrate can be patterned optically then etched or otherwise conditioned based on standard fabrication techniques.

The illustrated example birdcage resonator devices 100, 103, and 107 in FIGS. 1A, 1C and 1F respectively, include components (e.g., the conductor and substrate of each cell) with example sizes (e.g., thickness, length, width, spacing, etc.) and parameters (e.g., impedance, etc.). The sizes and the parameters can be designed, implemented, modified, or otherwise configured according to desired characteristics and functionalities of the devices, applications, system requirements, or other criteria. In some implementations, the resonance frequency of the example birdcage resonator can be reduced or otherwise modified, for example, by having zig-zag shape, edge-coupled capacitors in the ring and high dielectric-constant materials ($LaAlO_3$), by having distributed elements in rings and legs instead of lumped circuit components, by configuring capacitors in the rings to be either edge-coupled or end-coupled, by implementing lumped circuit components (Interdigital capacitor, zig-zag inductor, edge-coupled capacitance), or a combination of these and other techniques.

Figure 2:
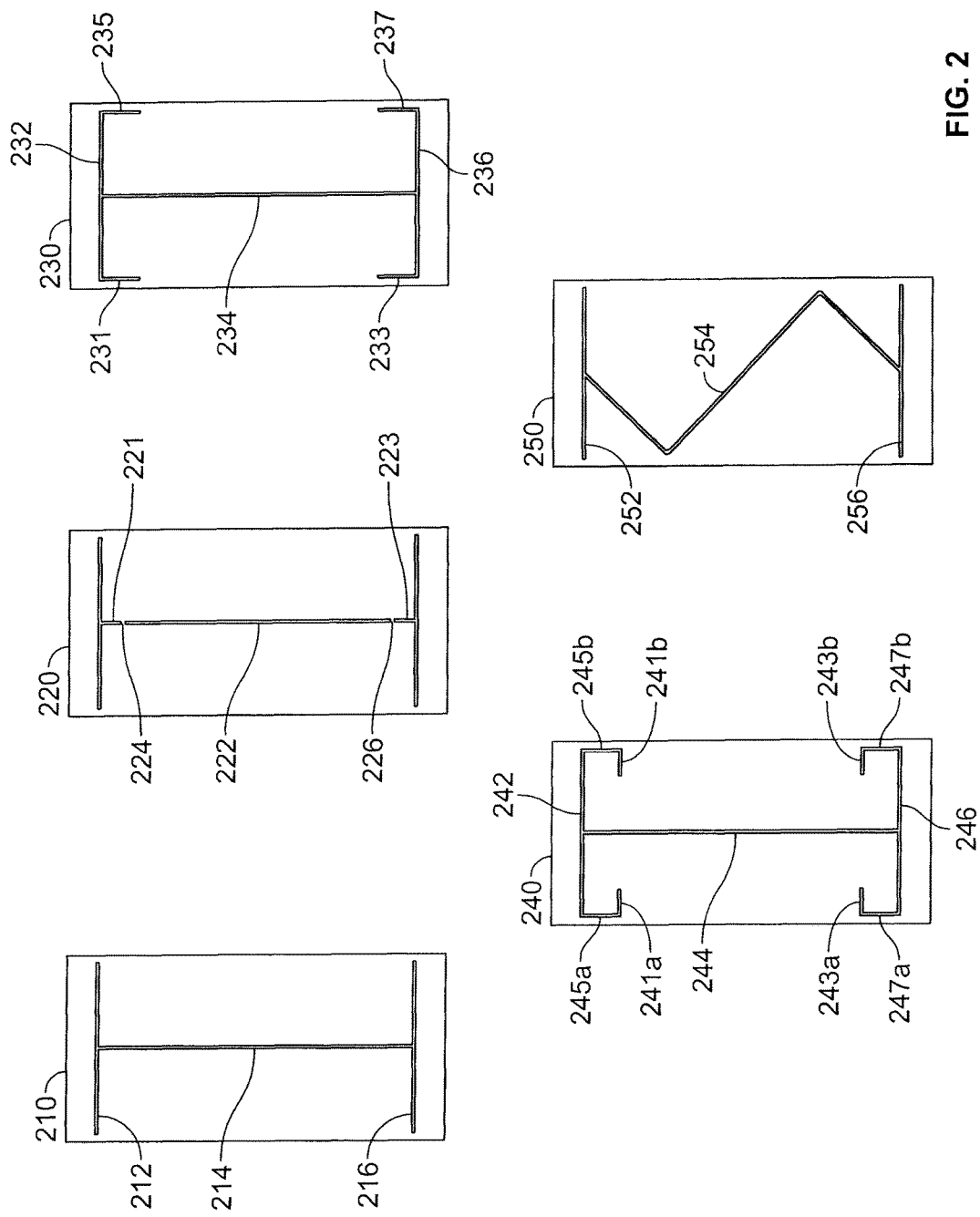
FIG. 2 is a schematic diagram of example cell topologies for a birdcage resonator device.
Figure 2:
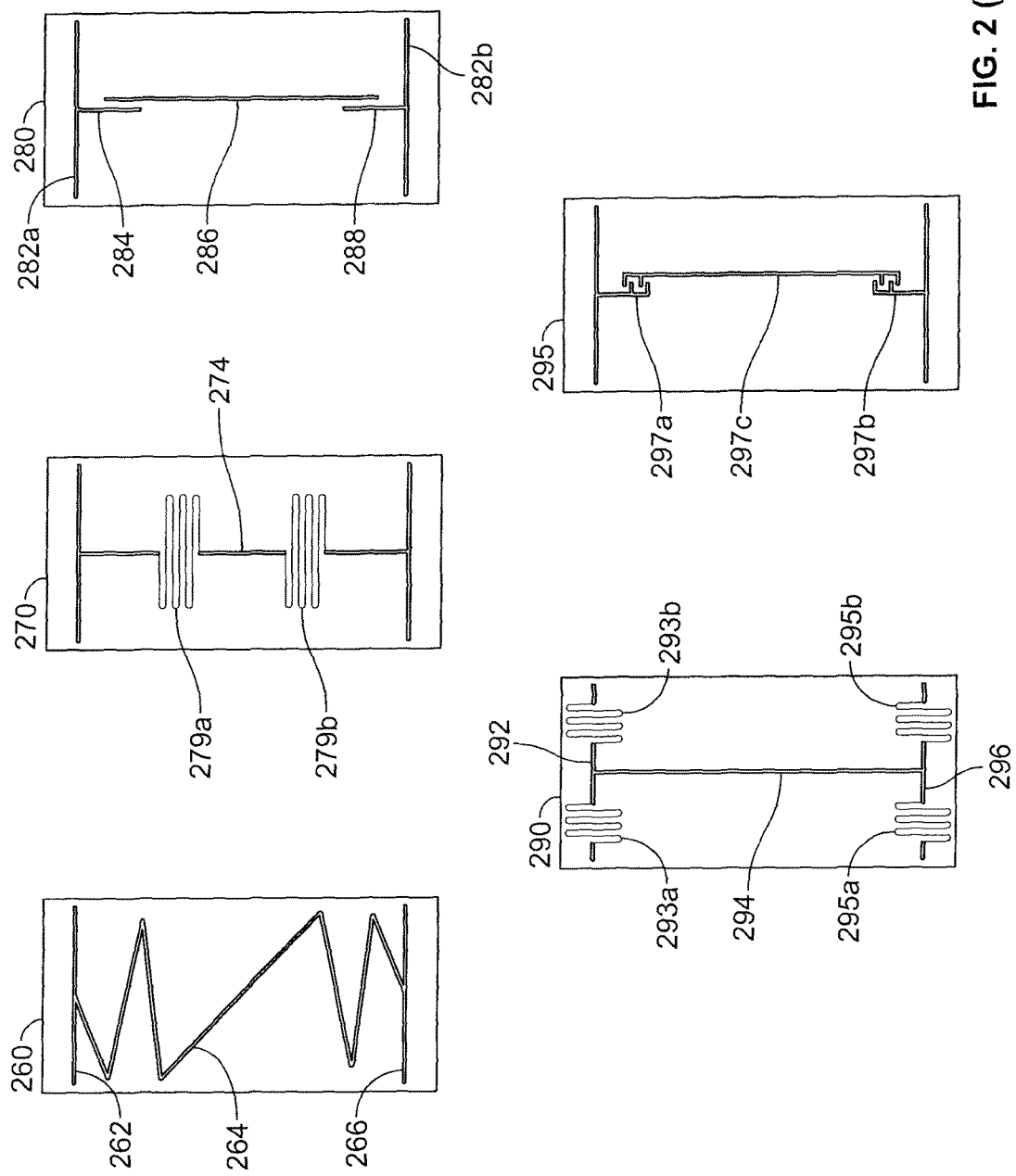

In some implementations, the birdcage resonator device can include other types of cells (e.g., in different dimensions, shapes, or topologies (e.g., as shown in FIG. 2)). In some implementations, multiple cells can be assembled in an arrangement (e.g., as a cylinder, a prism, a polyhedron, etc.) other than the example arrangements shown in FIGS. 1A, 1C, and 1F respectively. The birdcage resonator device can be used, for example, as an MR probe and operated to produce a magnetic field in a sample region (e.g., the central interior region 160, 163 or 168) inside the birdcage structure. For example, the birdcage resonator device may produce a radio-frequency (RF) or microwave-frequency magnetic field configured to manipulate nuclear or electron spins in the sample region.

FIG. 2 includes a series of schematic diagrams of example resonator cell topologies 210, 220, 230, 240, 250, 260, 270, 280, 290, 295. The example resonator cell topologies specify example configurations of one or more resonators deposited on a substrate of a cell. Each of the cell topologies corresponds to a capacitive and inductive scheme that includes one or more capacitive and inductive elements. The capacitive and inductive elements can form one or more periods of the ladder network of a birdcage resonator device. For example, the example cell topology 210 is implemented by the cells 150a, 150b, 150c, 150d and cells 158a, 158b, 158c, 158d of the birdcage resonator device 100 in FIG. 1A and 107 in FIG. 1F, respectively. The example cell topology 280 is implemented by the example cells 153a, 153b, 153c, 153d of the example birdcage resonator device 100 in FIG. 1C. A birdcage resonator device can include cells implemented using one or more of other topologies shown in FIG. 2.

The bold lines in each of the resonator cell topologies shown in FIG. 2 represent conductors deposited on the dielectric substrate. The conductors shown in a cell topology can all be deposited on a same surface of the cell (e.g., as in the example cells 150a, 150b, 150c, 150d of the example birdcage resonator device 100 in FIG. 1A); or one or more pieces of the conductors can be deposited on another surface of the cell (e.g., as in the example cells the example cells 153a, 153b, 153c, 153d of the example birdcage resonator device 103 in FIG. 1C). The example cell topologies show various features of a cell of a birdcage resonator device schematically; actual dimensions (lengths, width, and thickness of the conductor and substrate), conductor and substrate materials (dielectric constant, attenuation constant, etc.), and geometry of the cell can be determined based on, for example, desired resonant frequencies, sample volume, or other factors.

Each of the example resonator cell topologies shows a capacitive and inductive scheme. For instance, the example cell topology 210 shows an example capacitive and inductive scheme that includes ring element conductors 212 and 216 and leg element conductor 214. The two ends of the leg element conductor 214 are connected with the ring element conductors 212 and 216, respectively. While the example topology 210 shows connected conductors 212, 214, and 216, the example cell topology 220 shows another capacitive and inductive scheme in which the three leg element conductor 221, 222 and 223 are separated by dielectric gaps 224, 226. The dielectric gaps 224, 226 can include vacuum, dielectric material (e.g., sapphire, silicon, quartz, etc.), or a combination of them. In some implementations, the dielectric gaps 224, 226 can provide capacitive coupling between two corresponding ends of conductors.

Various ring and leg elements can be designed or otherwise configured to form different capacitive and inductive schemes. For example, example cell topologies 230 and 240 show variations of the ring elements 212 and 216 of the example cell topology 210. Specifically, the ring elements 232 and 236 of the example cell topology 230 are connected to elements 231 and 235, 233 and 237 that stem from the ends of the ring elements 232 and 236 respectively. The elements 231 and 235, 233 and 237 extend perpendicular to the ring elements 232 and 236, in parallel with the leg element 234. As another example, the ring elements 242 and 246 of the example cell topology 240 are connected to elements 245a-b, and 247a-b that stem from the ends of the ring elements 242 and 246 and extend perpendicular to the ring elements 242 and 246, in parallel with the leg element 244. The elements 245a, 245b, 247a, and 247b are further connected to elements 241a, 241b, 243a, and 243b respectively that extend in parallel with the ring elements 242 and 246.

Example cell topologies 250 and 260 show variations of the leg element 214 in the example cell topology 210. In some implementations, a leg element of a cell does not need to be perpendicular to ring elements. For instance, cell topologies 250 and 260 include example zig-zag leg elements 254 and 264 that connect their respective ring elements. In some implementations, leg elements (or ring elements) of a cell can be deposited on different surfaces of the cell. The example cell topology 280 includes example leg element 286 deposited on one side of the cell whereas the leg elements 284 and 288 deposited on the other side of the cell. The leg elements 284, 286, and 288 can be aligned or offset with each other. In some implementations, a leg element can include, for example, coils or otherwise shaped portions. For instance, the leg element 274 of the example cell topology 270 includes two coils 279a and 279b. The example cell topology 295 includes three leg elements 297a, 297b and 297c that are complementarily shaped and coupled with each other. The coils and otherwise shaped elements can be used, for example, to enhance the capacitive or inductive coupling among the conductors and to achieve desired capacitive and inductive characteristics. Similarly, the ring element can include, for example, coils or otherwise shaped portions. For instance, the ring elements 292 and 296 of the example cell topology 290 include coils 293a and 293b, and 295a and 295b, respectively.

Additional or different topologies can be used to form additional or different capacitive and inductive schemes and achieve desired features. Various inductance and capacitance schemes can be further combined to generate additional configurations. In some implementations, two or more cells of a birdcage resonator can have identical, similar, or different cell topologies.

Figure 3:
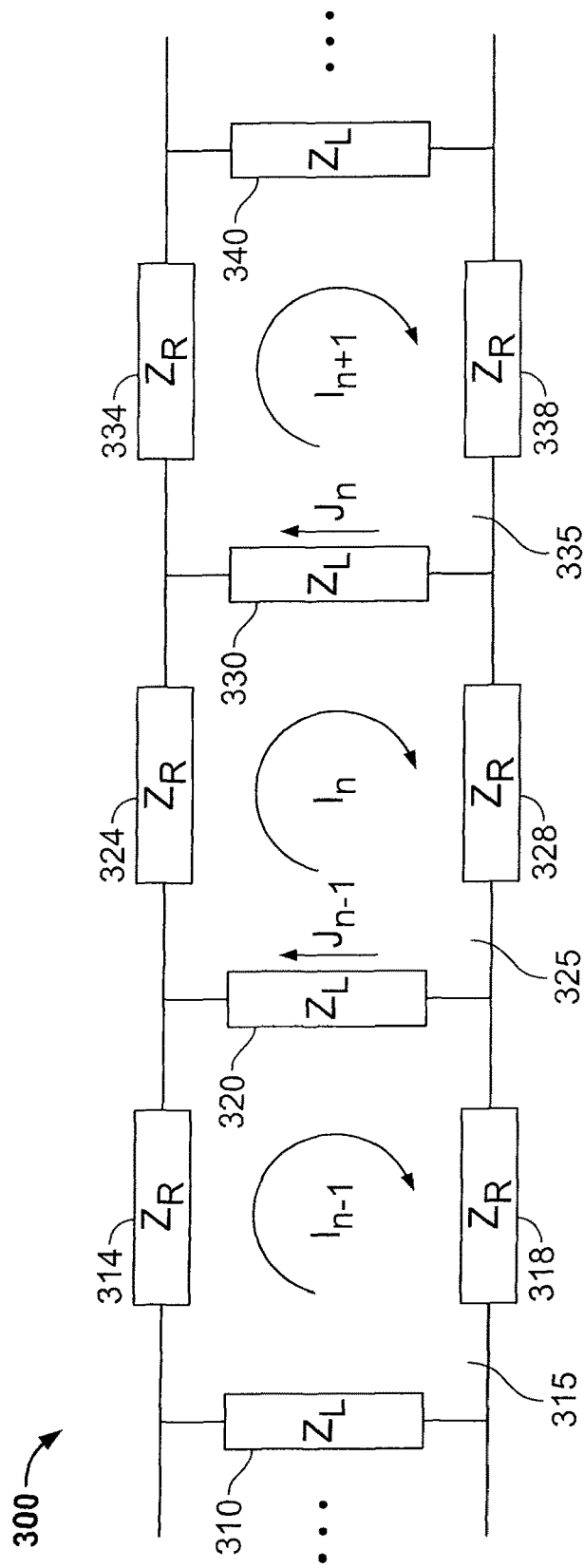
FIG. 3 is a circuit diagram of an example circuit model for a birdcage resonator device.

FIG. 3 is a circuit diagram of an example circuit model 300 for a birdcage resonator device. For example, the circuit model 300 can be used to model some aspects of the example resonators 100, 103, and 107 in FIGS. 1A, 1C and 1F, respectively. In the example shown in FIG. 3, a birdcage resonator can be modeled as a linear network of identical filter cells (e.g., cells 315, 325, 335) with each leg element (e.g., elements 310, 320, 330, 340) and ring element (e.g., elements 314, 318, 324, 328, 334, 338) represented by a series combination of equivalent lumped inductors and capacitors. For example, as shown in FIG. 3, the leg and ring impedances are denoted by $Z_L$ and $Z_R$, respectively. The leg and ring impedances can be designed, derived, measured, or otherwise determined based on, for example, the dielectric substrates and conductors of the example resonators 100, 103 and 107 in FIGS. 1A, 1C and 1F, respectively. The circuit model 300 can be periodic with the end and front connected to each other. The mesh current and leg current of the cell n can be denoted as $I_n$ and $J_n$, respectively, and they can be related according to $J_n = I_{n+1} - I_n$. The leg impedance $Z_L$ and ring impedance $Z_R$ can be identical or different for each of the cells. In some instances, the values of the leg impedance $Z_L$ and ring impedance $Z_R$ of the multiple cells of the birdcage resonator device can be designed, modified, or otherwise configured based on, for example, a sample, a system model, a desired resonance frequency, or other criteria.

In some instances, ignoring the mutual inductance between parallel current elements and performing mesh analysis, a set of linear equations (1) can be obtained $$Z_L(I_{n+1}+I_{n-1})-2(Z_R+Z_L)I_n=0 \qquad (1)$$

for n=1,2, ..., N, where $I_n$ is the current associated with the $n^{th}$ mesh and N is the number of legs or meshes. Using the periodic property of the circuit as $I_{n+N}=I_n$ relation, the set of equations (1) can be rewritten in a matrix representation as shown by equation (2).

$$\begin{bmatrix} -2(Z_R+Z_L) & Z_L & 0 & \cdots & Z_L \\ Z_L & -2(Z_R+Z_L) & Z_L & \cdots & 0 \\ 0 & Z_L & -2(Z_R+Z_L) & & 0 \\ \vdots & \vdots & \vdots & \ddots & \vdots \\ Z_L & 0 & 0 & & -2(Z_R+Z_L) \end{bmatrix} \begin{bmatrix} I_1 \\ \vdots \\ I_n \\ \vdots \\ I_N \end{bmatrix} = 0 \quad (2)$$

The resonant modes of the network can be the roots of the determinant of the coefficient matrix. Each mode is associated with a root of one of the eigenvalues of the matrix and the current vector is the corresponding eigenvector.

In some instances, the coefficient matrix can be a circulant matrix. The $j^{th}$ eigenvector and eigenvalue can be found analytically according to equations (3) and (4).

$$V_j = \left[ \left(e^{\frac{j2\pi i}{N}}\right)^0 \; \left(e^{\frac{j2\pi i}{N}}\right)^1 \; \cdots \; \left(e^{\frac{j2\pi i}{N}}\right)^{N-1} \right]^T, \quad (3)$$

$$\lambda_j = -2(Z_R+Z_L) + Z_L e^{\frac{j2\pi i}{N}} + Z_L e^{\frac{j2\pi i(N-1)}{N}}. \quad (4)$$

for $j=0, 1, \ldots, N-1$.

Inserting the leg and ring impedance $$Z_L = i\omega L_L + \frac{1}{i\omega C_L} \text{ and } Z_R = i\omega L_R + \frac{1}{i\omega C_R}$$

into the eigenvalue equation $\lambda_j=0$, the $j^{th}$ resonant frequency can be calculated as $$\omega_j = \sqrt{\frac{\frac{1}{C_R} + \frac{1}{C_L}\left[1 - \cos\left(\frac{2j\pi}{N}\right)\right]}{L_R + L_L\left[1 - \cos\left(\frac{2j\pi}{N}\right)\right]}} \quad (5)$$

for $j=0, 1, \ldots, N-1$, corresponding to the leg's current distribution, $J_n=I_{n+1}-I_n$. The eigenvector can be calculated as $$W_j = i2\sin\frac{j\pi}{N} e^{\frac{j\pi i}{N}} \left[ \left(e^{\frac{j2\pi i}{N}}\right)^0 \; \left(e^{\frac{j2\pi i}{N}}\right)^1 \; \cdots \; \left(e^{\frac{j2\pi i}{N}}\right)^{N-1} \right]^T. \quad (6)$$

for $j=0, 1, \ldots, N-1$.

According to equations (5) and (6), degeneracy can occur at resonant frequencies $\omega_{N-j}$ and $\omega_j$ with the property of $\omega_{N-j}=\omega_j$ and $W_{N-j}\neq W_j$. In this case, only N/2+1 (N is even) number of distinct resonant frequencies are usable in this structure. If N were odd in this example, then only (N+1)/2 number of distinct resonant frequencies would be usable.

The table 600 in FIG. 6 illustrates general resonant frequencies associated with an example birdcage resonator with N=4, 6, and 8 legs.

In some instances, a surface current on a long cylinder with the distribution $J_s(\varphi)=\hat{z}J_0 \sin\varphi$ can result in a transverse magnetic field B ($\rho$, $\varphi$)=$\hat{x}\mu_0 J_0/2$ inside the cylinder. Therefore, for the resonant mode corresponding to J=1, currents in the legs can have a successive $2\pi/N$ phase shift that produces a transverse magnetic field perpendicular to the axis of the cylinder. By increasing the number of legs, the magnetic field can become more homogenous. Other resonant modes can create gradient transverse magnetic fields at the center of the cylinder.

Figure 4A:
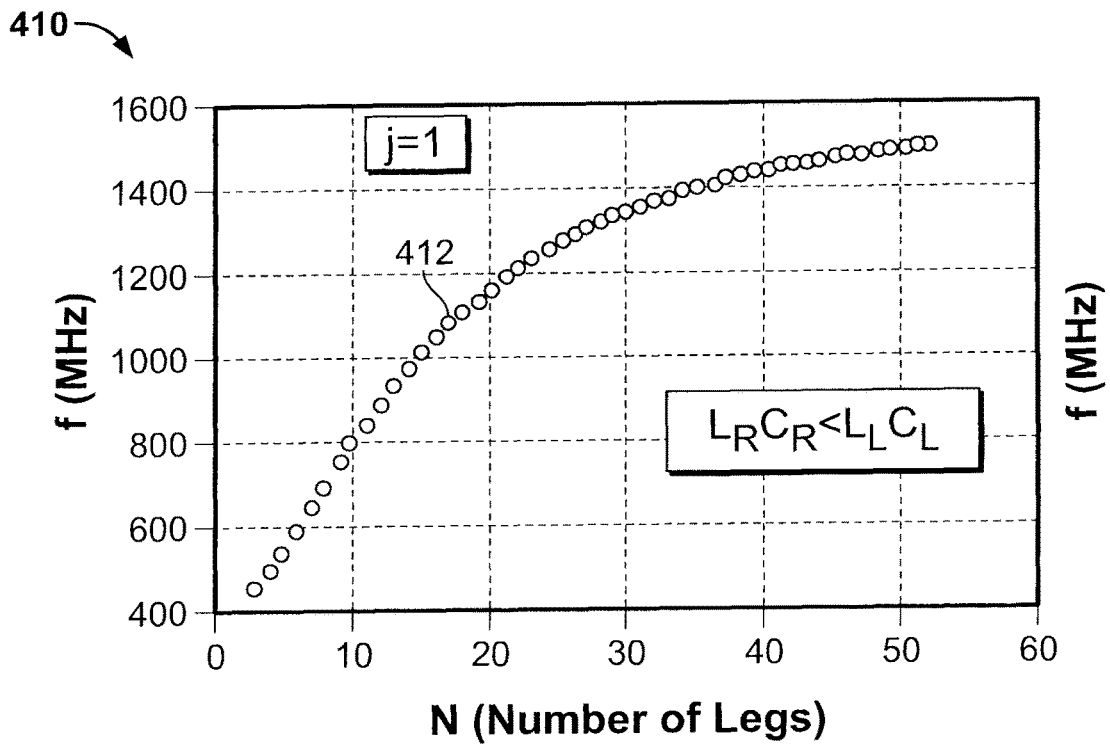
FIGS. 4A and 4C are plots showing example resonant frequencies of example birdcage resonators for different numbers of legs.
Figure 4B:
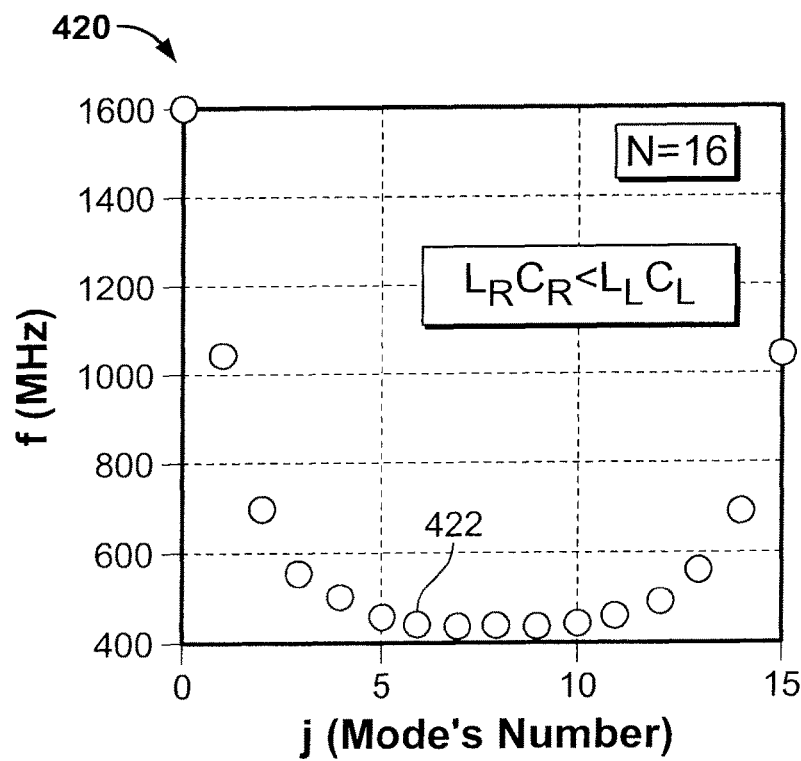
FIGS. 4B and 4D are plots showing example resonant frequencies of the example birdcage resonators for different orderings of resonant modes.
Figure 4C:
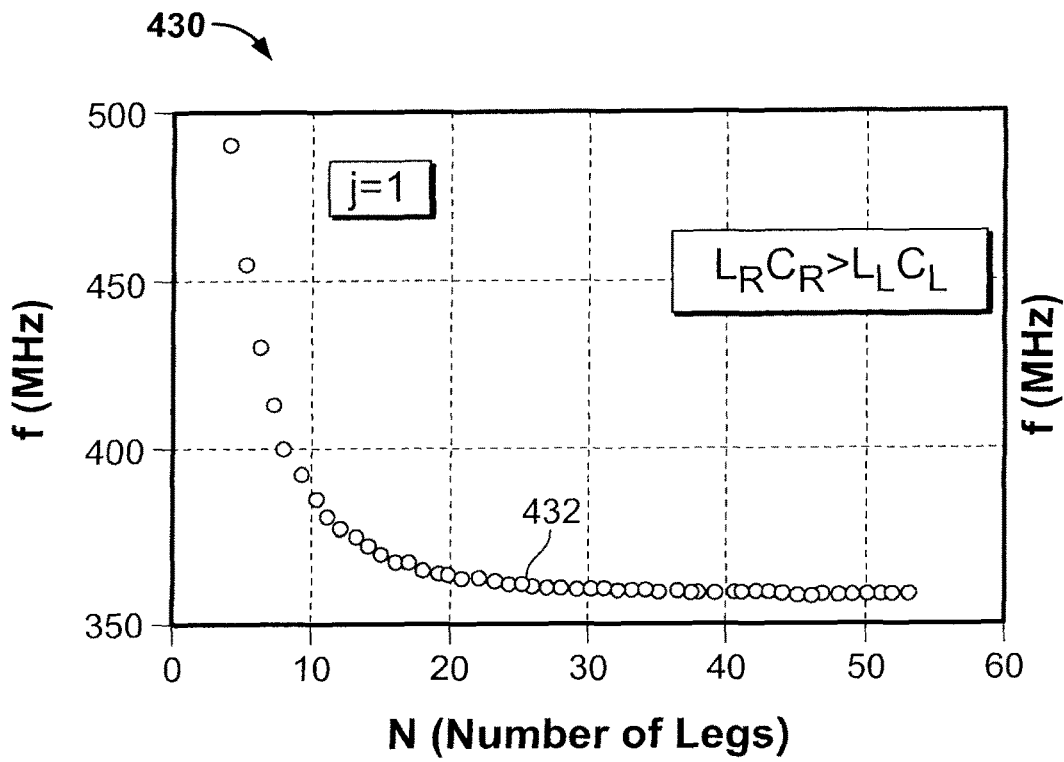

FIGS. 4A and 4C are plots 410 and 430 showing resonant frequencies of example birdcage resonators for different numbers of legs. Equation (5) shows that by increasing the number of legs in the birdcage resonator, the resonant frequencies decrease if the $L_R C_R > L_L C_L$ condition is satisfied. For instance, the circuit parameters corresponding to the plot 410 in FIG. 4A are $L_R=10$ nH, $C_R=1$ pF, $L_L=200$ nH, $C_L=1$ pf, and hence $L_R C_R < L_L C_L$. Plot 410 shows the example resonant frequency 412 for the first transverse mode (j=1) increases as the number of legs increases. In another example shown in FIG. 4C, the circuit parameters are $L_R=200$ nH, $C_R=1$ pF, $L_L=10$ nH, $C_L=1$ pF such that $L_R C_R > L_L C_L$. The example resonant frequency 432 in plot 430 for the first transverse mode (j=1) decreases as the number of legs increases.

Figure 4D:
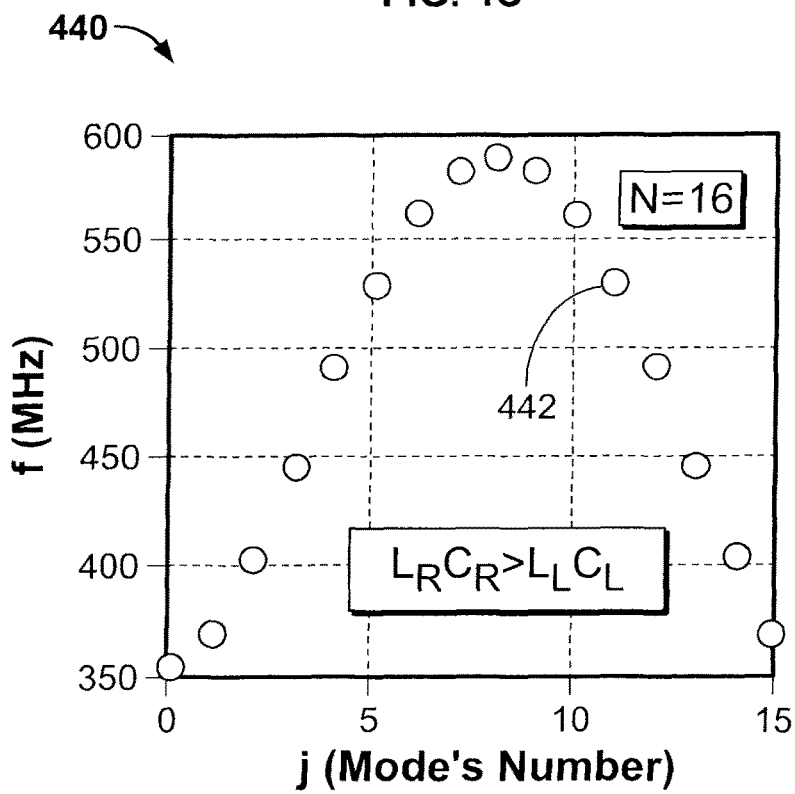

FIGS. 4B and 4D are plots 420 and 440 showing resonant frequencies of example birdcage resonators for different orderings of resonant modes. The example birdcage resonators of both FIGS. 4B and 4D have N=16 legs. The circuit parameters of the example birdcage resonator of FIG. 4B are $L_R=10$ nH, $C_R=1$ pF, $L_L=200$ nH, $C_L=1$ pf, which is the same as the birdcage resonator of FIG. 4A where the condition $L_R C_R < L_L C_L$ is satisfied. Plot 420 shows the resonant frequency 422 of $j^{th}$ mode of the example birdcage resonator, j=0, . . . , 15. The example birdcage resonator of FIG. 4D has circuit parameters $L_R=200$ nH, $C_R=1$ pF, $L_L=10$ nH, $C_L=1$ pF, which is the same as the example birdcage resonator of FIG. 4C where the condition $L_R C_R > L_L C_L$ is satisfied. In this case, the first mode (j=0) is longitudinal ($\omega_0$); the second mode (j=1) is transverse with the degeneracy ($\omega_1=\omega_{15}$); and the third mode is the gradient mode ($\omega_2$), etc.

Figure 5A:
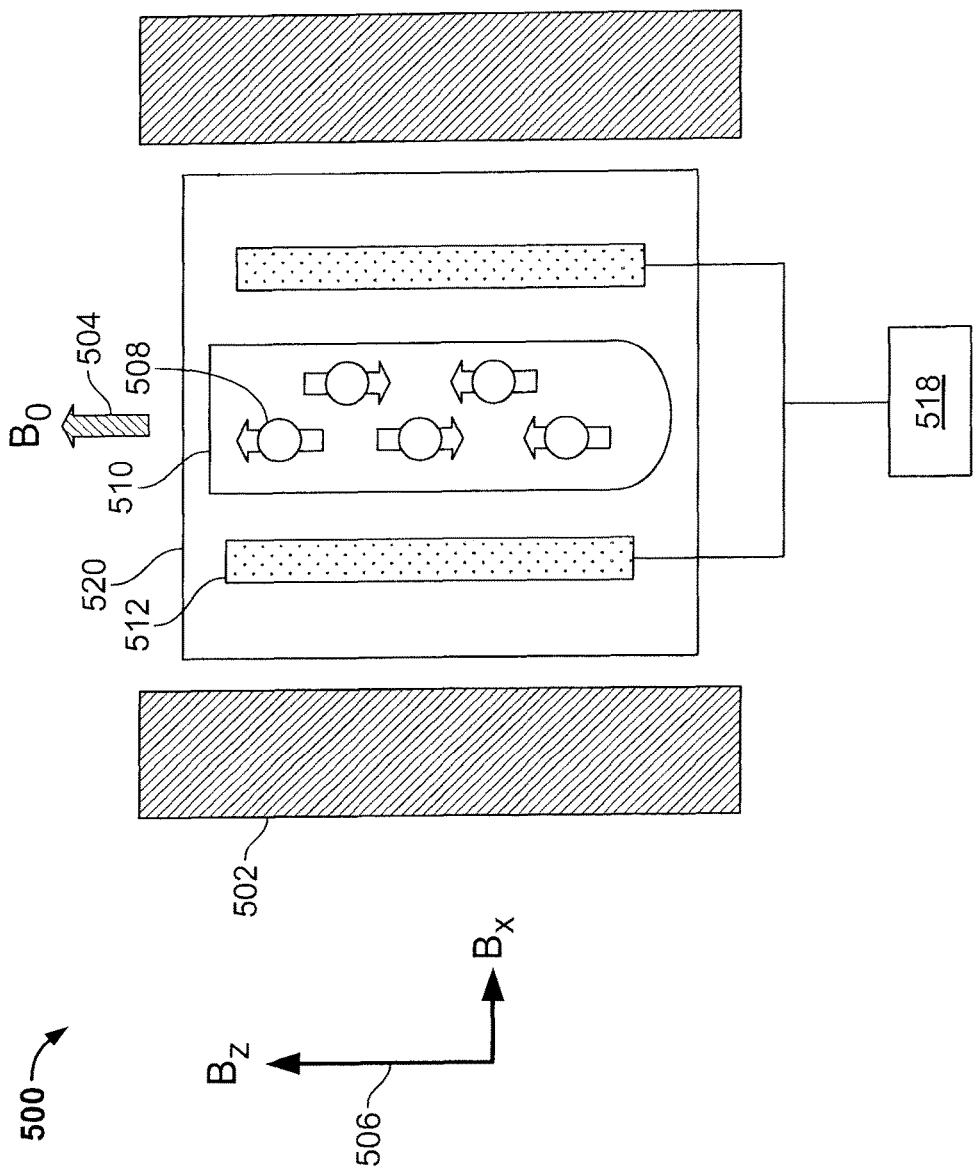
FIG. 5A is a schematic diagram of an example magnetic resonance system.

FIG. 5A is a schematic diagram of an example magnetic resonance system 500. The example magnetic resonance system 500 shown in FIG. 5A includes a primary magnet system 502, a cooling system 520, a birdcage resonator system 512, a sample 510 that contains spins 508, and a control system 518. A magnetic resonance system may include additional or different features, and the components of a magnetic resonance system can be arranged as shown in FIG. 5A or in another manner.

The example birdcage resonator system 512 can magnetically interact with the spins 508 in the sample 510. In some cases, the birdcage resonator system 512 drives Rabi oscillations in the spin ensemble by applying a resonant field, or the birdcage resonator system 512 may perform other functions. In some implementations, the birdcage resonator system 512 can include the example resonators 100, 103 or 107 in FIGS. 1A-1H, or another resonator structure can be used.

The example cooling system 520 provides a thermal environment for the birdcage resonator system 512. In some cases, the cooling system 520 can absorb heat to maintain a low temperature of the birdcage resonator system 512. In the example shown in FIG. 5A, the cooling system 520 resides in thermal contact with the birdcage resonator system 512. In some cases, the cooling system 520 cools to liquid helium temperatures (e.g., approximately 4 Kelvin), liquid nitrogen temperatures (e.g., approximately 77 Kelvin), or at another cryogenic temperature. In some cases, the cooling system 520 can be implemented, for example, as a pulsed-tube refrigerator (e.g., 5-11 Kelvin), a pumped helium cryostat (e.g., 1.5 Kelvin), a helium-3 refrigerator (e.g., 300 milliKelvin), a dilution refrigerator (e.g., 15 milliKelvin), or another type of system. In some implementations, the birdcage resonator system 512 and the sample 510 are both held at cryogenic temperatures; in some cases, the sample 510, the birdcage resonator system 512, or both are held at a higher temperature (e.g., room temperature, etc.).

In the example shown in FIG. 5A, the spins 508 in the sample 510 interact independently with the primary magnet system 502 and the birdcage resonator system 512. The primary magnet system 502 quantizes the spin states and sets the Larmor frequency of the spin ensemble. Rotation of the spin magnetization can be achieved, for example, by a radio-frequency magnetic field generated by the resonator.

In the example shown in FIG. 5A, the spin ensemble can be any collection of particles having non-zero spin that interact magnetically with the applied fields of the magnetic resonance system 500. For example, the spin ensemble can include nuclear spins, electron spins, or a combination of nuclear and electron spins. Examples of nuclear spins include hydrogen nuclei ($^1$H), carbon-13 nuclei ($^{13}$C), and others. In some implementations, the spin ensemble is a collection of identical spin-1/2 particles.

The example primary magnet system 502 generates a static, uniform magnetic field, labeled in FIG. 5A and referred here to as the $B_0$ field 504. The example primary magnet system 502 shown in FIG. 5A can be implemented as a superconducting solenoid, an electromagnet, a permanent magnet or another type of magnet that generates a static magnetic field. In FIG. 5A, the example $B_0$ field 504 is homogeneous over the volume of the sample 510 and oriented along the z direction of the reference system 506. In some instances, a gradient system generates one or more gradient fields that spatially vary over the sample volume. In some cases, the gradient system includes multiple independent gradient coils that can generate gradient fields that vary along different spatial dimensions of the sample 510.

In the example system shown in FIG. 5A, interaction between the spins 508 and the primary magnet system 502 includes the Zeeman Hamiltonian H=−μ·B, where μ represents the magnetic moment of the spin and B represents the magnetic field. For a spin-1/2 particle, there are two states: the state where the spin is aligned with the $B_0$ field 504, and the state where the spin is anti-aligned with the $B_0$ field 504.

The example birdcage resonator system 512 couples to the spin ensemble containing the spins 508. If u(r) represents the resonator device's magnetic field spatial profile, then the mode volume can be expressed as $$V = \frac{\int |u(r)|^2 d^3 r}{\max[|u(r)|^2]}.$$

As such, the mode volume is related to the spatial profile of the resonator device's magnetic field, and higher spatial homogeneity in the cavity magnetic field generally produces a lower mode volume.

In some examples, the birdcage resonator system 512 has one or more drive frequencies and possibly other resonance frequencies or modes. The drive frequency can be tuned to the spins' resonance frequency, which is determined by the strength of the $B_0$ field 504 and the gyromagnetic ratio of the spins 508.

The example control system 518 can control the birdcage resonator system 512 and possibly other components or subsystems in the magnetic resonance system 500 shown in FIG. 5A. The control system 518 is electrically coupled to (e.g., by coaxial cables, etc.), and adapted to communicate with, the birdcage resonator system 512. For example, the control system 518 can be adapted to provide a voltage or current signal that drives the resonator system; the control system 518 can also acquire a voltage or current signal from the resonator system.

Figure 5B:
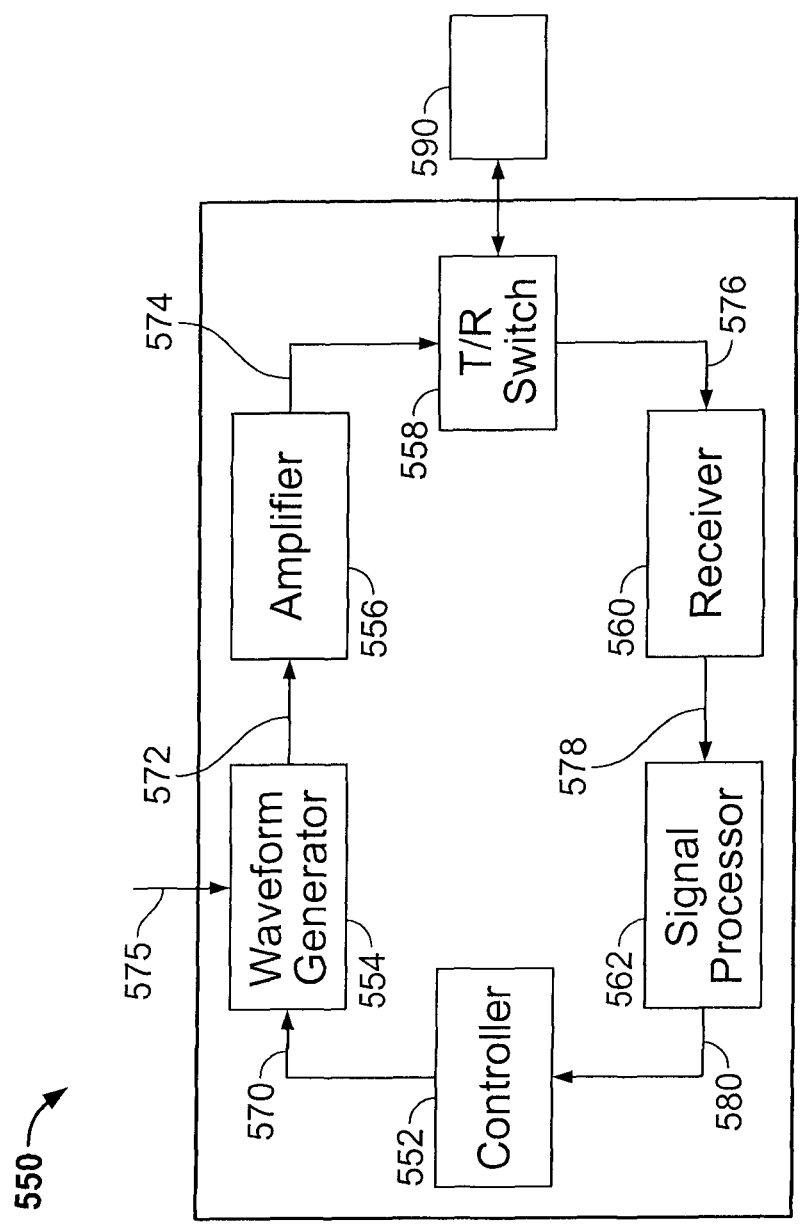
FIG. 5B is a schematic diagram of an example control system.

FIG. 5B is a schematic diagram of an example control system 550. The example control system 550 shown in FIG. 5B includes a controller 552, a waveform generator 554, and amplifier 556, a transmitter/receiver switch 558, a receiver 560, and a signal processor 562. A control system can include additional or different features (e.g., a gradient waveform generator, and gradient electronics, etc.), and the features of a control system can be configured to operate as shown in FIG. 5B or in another manner.

In the example shown in FIG. 5B, the example control system 550 is adapted to communicate with an external system 590. For example, the external system 590 can be the birdcage resonator system 512 of FIG. 5A, the birdcage resonator device 100 of FIG. 1, or another type of resonator system. The control system 550 can operate based on inputs provided by one or more external sources, including the external system 590 or another external source. For example, the control system can receive input from an external computer, a human operator, or another source.

The example control system 550 shown in FIG. 5B can operate in multiple modes of operation. In a first example mode of operation, the controller 552 provides a desired control operation 570 to the waveform generator 554. Based on the desired control operation 570, the waveform generator 554 generates a waveform 572. In some cases, the waveform generator 554 also receives system model data 575, and uses the system model data 575 to generate the waveform 572. The waveform 572 is received by the amplifier 556. Based on the waveform 572, the amplifier 556 generates a transmit signal 574. In this mode of operation, the transmitter/receiver switch 558 is configured to output the transmit signal 574 to the external system 590.

In a second example mode of operation, the transmitter/receiver switch 558 is configured to acquire a signal from the external system 590. The control system 550 can amplify, process, analyze, store, or display the acquired signal. As shown in FIG. 5B, based on the signal acquired from the external system 590, the transmitter/receiver switch 558 provides a received signal 576 to the receiver 560. The receiver 560 conditions the received signal 576 and provides the conditioned signal 578 to the signal processor 562. The signal processor 562 processes the conditioned signal 578 and generates data 580. The data 580 is provided to the controller 552 for analysis, display, storage, or another action.

The controller 552 can be (or include) a computer or a computer system, a digital electronic controller, a microprocessor or another type of data-processing apparatus. The controller 552 can include memory, processors, and may operate as a general-purpose computer, or the controller 552 can operate as an application-specific device.

In some implementations, the birdcage resonator (e.g., the example birdcage resonator devices 100, 103, 107 of FIGS. 1A, 1C, and 1F) can be manufactured. For example, multiple substrate cells can be prepared. The multiple substrate cells can be fabricated as structures made of dielectric material, such as for example, silicon, diamond, sapphire ($Al_2O_3$), $LaAlO_3$, MgO, or another material. Substrate cells can have two dominant surfaces (e.g., the surfaces or planes formed defined by length and width) that are substantially larger than the thickness or height.

In some implementations, one of the dominant surfaces can form an interior surface of a birdcage resonator device, which faces a central interior region (e.g., the central interior regions 160, 163 or 168 of the example birdcage resonator devices 100, 103 and 107, respectively). In some implementations, one of the dominant surfaces can form an exterior surface of a birdcage resonator device, which faces opposite the central interior region. A substrate cell can be fabricated into a rectangular, triangular, polygonal, or another shape, for example, depending on a desired birdcage structure of the resonator device.

In an example process for fabrication of a resonator device, one or more conductors are formed on the each of the substrate cells. The conductor material can be grown or deposited, for example, using standard fabrication techniques. The conductor can be chosen from, for example, high-temperature superconductors (HTS) (e.g., yttrium barium copper oxide (YBCO)), low temperature superconductors (LTS) (e.g., niobium (Nb)), other conductors (e.g., copper) or a combination of them. The conductors can form a thin-film layer on either or both dominant surfaces of a substrate cell. The conductors can be deposited, for example, according to a cell topology (e.g., the topologies 210, 220, 230, 240, 250, 260, 270, 280, 290, 295 in FIG. 2) that corresponds to a predefined inductance and capacitance scheme. The thickness of the conductors can be determined to achieve a desired electrical characteristic (e.g., inductance, capacitance, impedance, etc.).

After the cells are fabricated they are received for assembly. The cells can be substantially identical, or in some cases, one or more of the cells is distinct from the others. A three-dimensional resonator body is formed by assembling the cells together. The cells of the resonator body can be arranged symmetrically to define a periodic structure about a central interior region. The substrate and conductors of each cell can form one period of inductive and capacitive elements in periodic network of inductive and capacitive elements formed by the entire birdcage resonator. The periodic network of inductive and capacitive elements can be adapted to produce a magnetic field having multiple harmonic modes in the central interior region inside the birdcage structure.

In some cases, the cells of the resonator body form a substantially closed circumferential surface about the central interior region, and the closed circumferential surface can be open at the axial ends (e.g., as in FIGS. 1A, 1C, 1F). The circumferential surface can be generally cylindrical, prismatic, or otherwise. In some cases, the circumferential surface defines a longitudinal axis, and the cells define a structure that is periodic along the azimuthal or circumferential direction. For example, the cells can be assembled to form a birdcage structure, such as the example birdcage structures shown in FIGS. 1A, 1C and 1F, respectively. In some implementations, the multiple cells can be assembled in another manner. For instance, five cells may be assembled into a pentagonal prism such that the five cells forms the five lateral faces of the pentagonal prism.

In some aspects of what is described here, a resonator device includes a resonator body that includes multiple cells arranged about a central interior region. Each cell includes a dielectric substrate and a conductor disposed on the dielectric substrate. The cells define a periodic network of inductive and capacitive elements adapted to produce a magnetic field in the central interior region.

In some aspects of what is described here, a resonator device is manufactured. The cells are received and assembled to form a three-dimensional resonator body. In some cases, the conductor is deposited on the dielectric substrate to form inductive and capacitive elements according to a predefined inductance and capacitance scheme.

Implementations of these and other aspects may include one or more of the following features. The cells are arranged periodically and form a closed circumferential surface about the central interior region forming a three-dimensional structure. Each cell has a dielectric substrate.

Additionally or alternatively, implementations of these and other aspects may include one or more of the following features. The conductor includes a thin-film conductor. The conductor includes a superconductor material. The conductor in each cell includes a ring element and a leg element. In some instances, the leg element includes a first elongate conductor that extends parallel to the largest dimension of the central interior region, and the ring element includes a second elongate conductor that extends perpendicular to the leg element.

Additionally or alternatively, implementations of these and other aspects may include one or more of the following features. Each cell includes an interior surface facing the central interior region and an exterior surface facing opposite the central interior region. The dielectric substrate is planar on the exterior surface of each cell, the interior surface of each cell, or both. The conductor is disposed on the exterior surface, the interior surface, or both the exterior and interior surfaces of the dielectric substrate.

Additionally or alternatively, implementations of these and other aspects may include one or more of the following features. The cells that form the resonator body are substantially identical to each other. The resonator body is adapted to produce a radio-frequency or microwave-frequency magnetic resonance field. The central interior region is adapted to receive a sample containing a spin ensemble, and the cells are adapted to produce a magnetic resonance field that interacts with the spin ensemble While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented in multiple embodiments separately or in any suitable sub-combination.

A number of embodiments have been described. Nevertheless, it will be understood that various modifications can be made. Accordingly, other embodiments are within the scope of the following claims.

The invention claimed is:
1. A resonator device for a magnetic resonance system, the resonator device comprising:
    a resonator body comprising a periodic arrangement of a plurality of cells about a central interior region, each cell comprising a dielectric substrate and thin-film conductors disposed on the dielectric substrate;

wherein the plurality of cells forms lateral faces of the resonator body, and the thin-film conductors in each respective cell form:
- a leg element comprising an elongate leg element conductor, wherein the leg element extends in a longitudinal direction parallel to the largest dimension of the central interior region of the resonator body,
- a first ring element comprising a first elongate ring element conductor, wherein the first ring element extends perpendicular to the leg element, and
- a second ring element comprising a second elongate ring element conductor, wherein the second ring element extends perpendicular to the leg element,
- wherein the leg element extends from a central portion of the first ring element, along a center of the lateral face formed by the respective cell, to a central portion of the second ring element; and the periodic arrangement of the plurality of cells defining a periodic network of inductive and capacitive elements adapted to produce a magnetic field in the central interior region.

2. The resonator device of claim 1, wherein the plurality of cells form a closed circumferential surface about the central interior region, and the dielectric substrate of each cell occupies substantially an entire area allocated to the cell in the circumferential surface.

3. The resonator device of claim 1, wherein each cell comprises an interior surface facing the central interior region and an exterior surface facing opposite the central interior region, and the dielectric substrate is planar on the exterior surface of each cell.

4. The resonator device of claim 1, wherein the thin-film conductors comprise a superconductor material.

5. The resonator device of claim 1, wherein the plurality of cells are substantially identical to each other.

6. The resonator device of claim 1, wherein the central interior region is adapted to receive a sample containing a spin ensemble, and the plurality of cells are adapted to produce a magnetic resonance field that interacts with the spin ensemble.

7. The resonator device of claim 1, wherein the plurality of cells are adapted to produce a radio-frequency magnetic resonance field.

8. The resonator device of claim 1, wherein the plurality of cells are adapted to produce a microwave-frequency magnetic resonance field.

9. The resonator device of claim 1, wherein:
- the first elongate ring element conductor of each respective cell is capacitively coupled to the respective first elongate ring element conductors of two neighboring cells in the resonator body, and
- the second elongate ring element conductor of each respective cell is capacitively coupled to the respective second elongate ring element conductors of two neighboring cells in the resonator body.

10. The resonator device of claim 1, wherein the leg element of each cell comprises a sandwich structure that includes at least two elongate thin-film conductors on opposite sides of the dielectric substrate.

11. The resonator device of claim 1, wherein the plurality of cells is arranged to allow capacitive coupling between adjacent cells in the periodic arrangement.

12. A manufacturing method for manufacturing a resonator device, the method comprising:
- receiving a plurality of cells, each cell comprising a dielectric substrate and thin-film conductors disposed on the dielectric substrate; and
- assembling the plurality of cells to form a substantially closed circumferential surface of a resonator body about a central interior region, the plurality of cells defining a periodic network of inductive and capacitive elements adapted to produce a magnetic field in the central interior region;
- wherein the plurality of cells forms lateral faces of the resonator body, and the thin-film conductors in each respective cell form:
  - a leg element comprising an elongate leg element conductor, wherein the leg element extends in a longitudinal direction parallel to the largest dimension of the central interior region,
  - a first ring element comprising a first elongate ring element conductor, wherein the first ring element extends perpendicular to the leg element, and
  - a second ring element comprising a second elongate ring element conductor, wherein the second ring element extends perpendicular to the leg element,
  - wherein the leg element extends from a central portion of the first ring element, along a center of the lateral face formed by the respective cell, to a central portion of the second ring element.

13. The manufacturing method of claim 12, further comprising depositing the thin-film conductors on the dielectric substrate to form inductive and capacitive elements according to a predefined inductance and capacitance scheme.

14. The manufacturing method of claim 12, wherein the dielectric substrate of each cell occupies substantially an entire area allocated to the cell in the circumferential surface.

* * * * *